(12) United States Patent
Kwon et al.

(10) Patent No.: US 9,177,868 B2
(45) Date of Patent: Nov. 3, 2015

(54) ANNEALING OXIDE GATE DIELECTRIC LAYERS FOR REPLACEMENT METAL GATE FIELD EFFECT TRANSISTORS

(71) Applicant: International Business Machines Corporation, Armonk, NY (US)

(72) Inventors: Unoh Kwon, Fishkill, NY (US); Wing L. Lai, Hopewell Junction, NY (US); Vijay Narayanan, New York, NY (US); Ravikumar Ramachandran, Pleasantville, NY (US); Shahab Siddiqui, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 14/228,840

(22) Filed: Mar. 28, 2014

(65) Prior Publication Data
US 2015/0279744 A1 Oct. 1, 2015

(51) Int. Cl.
*H01L 21/8238* (2006.01)
*H01L 29/66* (2006.01)

(52) U.S. Cl.
CPC ...... *H01L 21/823828* (2013.01); *H01L 21/823857* (2013.01); *H01L 29/66545* (2013.01)

(58) Field of Classification Search
CPC ............... H01L 21/823828; H01L 21/823857; H01L 29/66545
USPC .................................. 438/154, 199, 591, 275
See application file for complete search history.

(56) References Cited

U.S. PATENT DOCUMENTS

| | | |
|---|---|---|
| 6,821,833 B1 | 11/2004 | Chou et al. |
| 6,828,185 B2 | 12/2004 | Lim et al. |
| 7,138,691 B2 | 11/2006 | Burnham et al. |
| 7,227,201 B2 | 6/2007 | Varghese et al. |
| 7,265,065 B2 | 9/2007 | Wang et al. |
| 7,435,651 B2 | 10/2008 | Varghese et al. |
| 7,544,533 B2 | 6/2009 | Mouli et al. |
| 7,544,561 B2 | 6/2009 | Lin et al. |
| 7,977,181 B2 * | 7/2011 | Lai et al. ........................ 438/199 |
| 2009/0230438 A1 | 9/2009 | Luo et al. |
| 2013/0017678 A1 * | 1/2013 | Tsai et al. ...................... 438/591 |
| 2014/0187028 A1 * | 7/2014 | Ando et al. .................... 438/585 |
| 2014/0315365 A1 * | 10/2014 | Chen et al. .................... 438/299 |
| 2015/0035084 A1 * | 2/2015 | Li et al. ......................... 257/410 |

OTHER PUBLICATIONS

Duong et al., "Effect of Nitrogen Incorporation on PMOS Negative Bias Temperature Instability in Ultrathin Oxy-Nitrides", IEEE International Integrated Reliability Workshop Final Report 2003, pp. 128-130.

* cited by examiner

*Primary Examiner* — Kevin M Picardat
(74) *Attorney, Agent, or Firm* — Erik K. Johnson

(57) ABSTRACT

A method of manufacturing a semiconductor structure by forming an oxide layer above a substrate; optionally annealing the oxide layer to densify the oxide layer; forming a first sacrificial gate above the substrate; removing the first dummy gate; optionally annealing the first gate oxide layer; and forming a first replacement metal gate above the gate oxide layer. In some embodiments selective nitridation may be performed during the annealing step.

20 Claims, 9 Drawing Sheets

ANNEALING OXIDE GATE DIELECTRIC LAYERS FOR REPLACEMENT METAL GATE FIELD EFFECT TRANSISTORS

BACKGROUND

The present invention relates to manufacturing semiconductor devices, particularly to manufacturing gate dielectric layers for Replacement Gate Field Effect Transistor (FET) structures.

FETs are commonly employed in electronic circuit applications. FETs may include a source region and a drain region spaced apart by a semiconductor channel region. In planar FETs, the semiconductor channel region may be a semiconductor substrate. In finFETs, the semiconductor channel region may be a semiconductor fin. A gate, potentially including a gate dielectric layer, a work function metal layer, and a metal electrode, may be formed above the channel region. By applying voltage to the gate, the conductivity of the channel region may increase and allow current to flow from the source region to the drain region.

FinFETs are an emerging technology which may provide solutions to field effect transistor (FET) scaling problems at, and below, the 22 nm node. FinFET structures include at least one narrow semiconductor fin as the channel region of the FET and are gated on at least two sides of each of the at least one semiconductor fin. FinFETs including more than one fin may be referred to as multi-fin FinFETs. FinFETs may be formed on bulk substrates to reduce wafer cost and/or enable formation of certain devices in the bulk substrate.

Due in part to the relative instability of the dielectric layer and work function metal layer of the gate, a gate-last process, also known as a replacement metal gate process, may be used where a sacrificial gate is formed prior to forming other components of the FET. The sacrificial gate may then be removed to form a recessed region that may then be filled with a replacement metal gate potentially including a gate dielectric layer, a work function metal layer, and a metal electrode.

BRIEF SUMMARY

An embodiment of the invention may include a method of manufacturing a semiconductor structure by forming an oxide layer above a substrate; annealing the oxide layer to densify the oxide layer; forming a first sacrificial gate above the substrate by depositing a dummy gate layer above the oxide layer then etching the dummy gate layer to form a first dummy gate and etching the oxide layer to form a first gate oxide layer separating the first dummy gate from the substrate; removing the first dummy gate; annealing the first gate oxide layer; and forming a first replacement metal gate above the gate oxide layer.

In another embodiment of the invention, a method of manufacturing a semiconductor structure may include forming an oxide layer above a substrate; annealing the oxide layer; selectively nitriding a portion of the oxide layer to form an NFET oxide layer, wherein the PFET oxide layer comprises an un-nitrided portion of the oxide layer; depositing a dummy gate layer above the NFET oxide layer and the PFET oxide layer etching the dummy gate layer to form a first dummy gate above the NFET oxide layer and a second dummy gate above the PFET oxide layer; etching the NFET oxide layer to form an NFET oxide gate layer between the first dummy gate and the substrate; etching the PFET oxide layer to form an PFET oxide gate layer between the second dummy gate and the substrate; and replacing the first dummy gate with a first replacement metal gate and the second dummy gate with a second replacement metal gate.

In another embodiment of the invention, a method of manufacturing a semiconductor structure may include forming an oxide layer above a substrate; depositing a dummy gate layer above the oxide layer; etching the dummy gate layer to form a first dummy gate and a second dummy gate above the oxide layer; etching the oxide layer to form a first oxide gate layer between the first dummy gate and the substrate and a second oxide gate layer between the second dummy gate and the substrate; removing the first dummy gate and the second dummy gate to expose the first oxide gate layer and the second oxide gate layer; annealing the first oxide gate layer and the second oxide gate layer; selectively nitriding the first oxide gate layer, so that the first gate oxide layer has a greater nitrogen concentration than the second gate oxide layer; and forming a first replacement metal gate above the first oxide gate layer and a second replacement metal gate above the second oxide gate layer.

BRIEF DESCRIPTION OF THE SEVERAL DRAWINGS

Figure 1A:
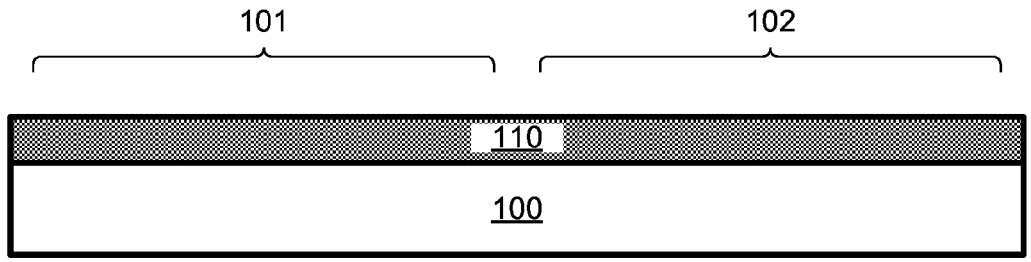
FIG. 1a is a side view depicting depositing an oxide layer on a substrate, according to an exemplary embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

During manufacture of gate dielectric layers for replacement gate field effect transistors (FETs), including planar FET and FinFET structures, many processes occurring after deposition of the gate dielectric layers may have a detrimental impact on the performance of the device. Processing may detrimentally impact variables such as Time Dependent Dielectric Breakdown (TDDB) and Negative Bias Temperature Instability (NBTI). For example, removal of masking layers or dummy materials by chemical or mechanical means may damage the final surfaces of a gate dielectric layer. Exemplary embodiments, as described below in conjunction with FIGS. 1a-3f, include performing a high temperature anneal on an oxide gate dielectric layer prior to and/or following the formation of gate structures. Such high temperature anneals may improve the reliability of the resultant semiconductor material by densifying the gate oxide material. Further, exemplary embodiments may include nitriding an NFET of the gate oxide while not nitriding a PFET region of the gate oxide. Selective nitridation of the NFET region may improve TDDB while preventing PFET degradation.

Referring to FIG. 1a, an oxide layer 110 may be formed on a semiconductor substrate 100. The oxide layer 110 may be made from any of several known oxides or oxynitrides derived from a semiconductor material. Semiconductor materials may include any elemental semiconductor known in the art, an alloy of at least two elemental semiconductor materials, a III-V compound semiconductor material, a II-VI compound semiconductor material, or any combination thereof. In an exemplary embodiment, the semiconductor material may be silicon. For example, the oxide layer 110 may be made of silicon oxide or silicon oxynitride. The oxide layer 110 may have a thickness, for example, ranging from approximately 1 nm to approximately 10 nm, preferably ranging from approximately 2 nm to approximately 4 nm. However, greater and lesser thicknesses of the oxide layer 110 are explicitly contemplated.

In some embodiments, the oxide layer 110 is deposited to form a gate dielectric of one or more FET structures. In an exemplary embodiment, deposition of the oxide layer 110 may be performed by any suitable deposition technique such as, for example, atomic layer deposition (ALD), chemical vapor deposition (CVD), plasma enhanced CVD, spin-on deposition, or physical vapor deposition (PVD). In other embodiments, the oxide layer 110 may be grown on substrate 100 using any known process.

The substrate 100 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In some embodiments, the substrate 100 may be a bulk semiconductor substrate. In such embodiments, the substrate 100 may be approximately, but is not limited to, several hundred microns thick. For example, the substrate 100 may have a thickness ranging from approximately 0.5 mm to approximately 1.5 mm. In other embodiments the substrate 100 may be a semiconductor-on-insulator (SOI) substrate, where a buried insulator layer (not shown) separates a base substrate (not shown) from a top semiconductor layer. In other embodiments where a finFET structure is being fabricated, the substrate 100 may be a semiconductor fin. Additionally, the substrate may include separate regions containing either NFET or PFET gates. For illustrative simplicity, the drawings and description only refer to a single PFET region 101 and a single NFET region 102, however multiple PFET gates and NFET gates may be formed on the same device.

Figure 1B:
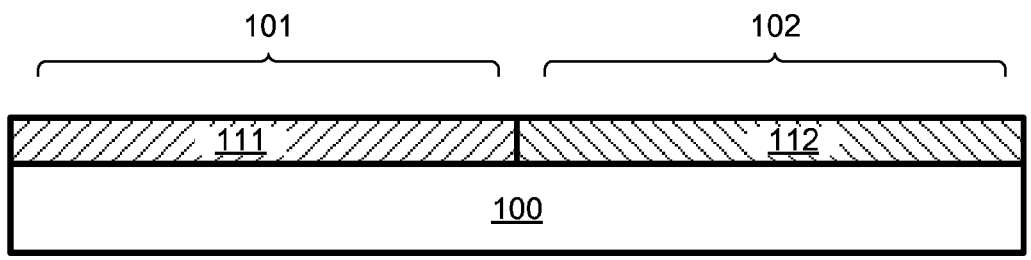
FIG. 1b is a side view depicting annealing and selectively nitriding the oxide layer, according to an exemplary embodiment.

Referring to FIG. 1b, the oxide layer 110 (FIG. 1a) may be annealed. The oxide layer 110 may be annealed to densify the oxide layer 110 prior to junction formation. The oxide layer 110 may be annealed at temperatures ranging from approximately 600° Celsius to approximately 1200° Celsius and may be annealed for approximately 10 to approximately 30 seconds. In some embodiments, the annealing temperature may be substantially uniform throughout the annealing period, however in other embodiments the annealing period include one or more ramping cycles where the temperature is decreased or increased.

Still referring to FIG. 1b, in some embodiments, the oxide layer 110 may be selectively nitrided to form a PFET oxide layer 111 and a NFET oxide layer 112. Nitriding the oxide layer 110 may improve TDDB of FETs formed in NFET region 102, but may also cause NBTI degradation of FETs formed in the PFET region 101. Therefore, selectively nitriding the oxide layer 110 in the NFET region 102 to form an NFET oxide layer 112 while protecting the oxide layer 110 in the PFET region 101 may provide the benefits noted above, without the detrimental impacts, of nitriding the entire oxide layer 110. This may be accomplished, for example, by masking the PFET region 101 with a nitrogen impermeable layer and nitriding the substrate, as described below in conjunction with FIGS. 2a-2f. Other suitable means of selectively nitriding the oxide layer 110 may be performed. In such instances, the PFET oxide layer 111 and the NFET oxide layer 112 may exhibit different nitrogen concentrations. However, in other embodiments, the nitridation process may not be performed, and the PFET oxide layer 111 and NFET oxide layer 112 may have approximately the same nitrogen concentration.

Figure 1C:
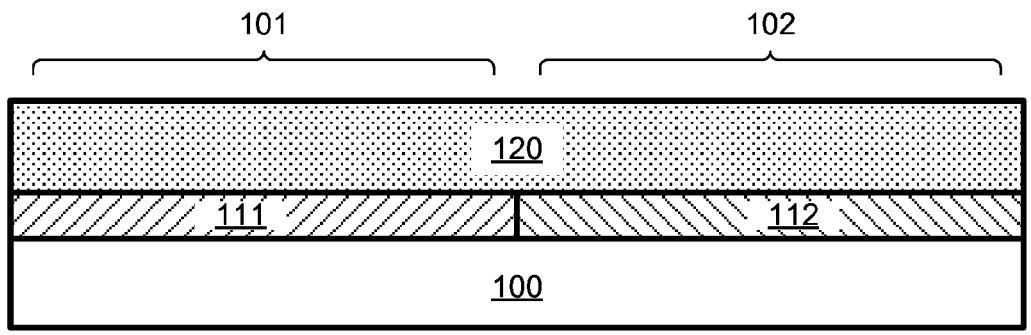
FIG. 1c is a side view depicting forming a dummy gate electrode layer above the oxide layer, according to an exemplary embodiment.

Referring to FIG. 1c, a dummy gate layer 120 may be deposited above the PFET oxide layer 111 and NFET oxide layer 112. The dummy gate layer 120 may be deposited in part to protect the PFET oxide layer 111 and NFET oxide layer 112 during subsequent processing while also functioning as placeholder for a later-formed replacement metal gate. In such embodiments, the dummy gate layer 120 may be made of any suitable sacrificial material, for example, amorphous or polycrystalline silicon. The dummy gate layer 120 may have any thickness ranging from approximately 30 nm to approximately 200 nm. The dummy gate layer 120 may be deposited by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD).

Figure 1D:
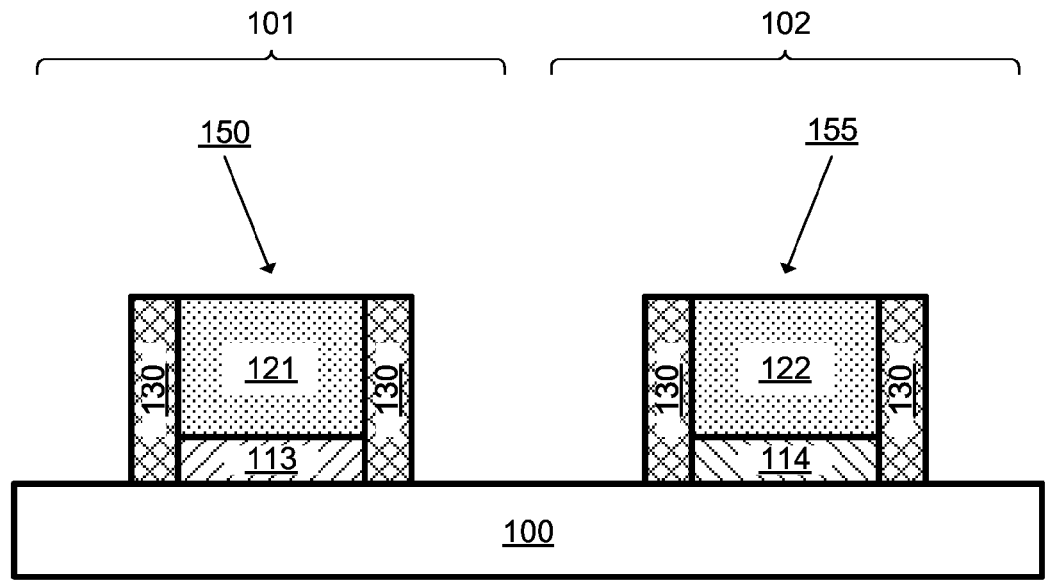
FIG. 1d is a side view depicting forming gates on the substrate, according to an exemplary embodiment.

Referring to FIG. 1d, a PFET gate structure 150 and an NFET gate structure 155 may be formed. Formation of the PFET gate structure 150 and the NFET gate structure 155 may be accomplished by lithographic patterning of the regions, and subsequently etching away the dummy gate layer 120, the PFET oxide layer 111 and the NFET oxide layer 112 from the unpatterned areas. Following patterning and removal, the PFET gate structure 150 may include a first PFET oxide gate layer 113 and a PFET dummy gate 121, while the NFET gate structure 155 may include a first NFET oxide gate layer 114 and an NFET dummy gate 122. Suitable lithographic materials include, for example, a photoresist layer. Etching may be accomplished by any suitable technique, such as, for example, reactive ion etching (RIE) or wet stripping.

Still referring to FIG. 1d, spacers 130 may be formed adjacent to the PFET gate structure 150 and the NFET gate structure 155. The spacers 130 may be made of any insulating material, such as silicon nitride, silicon oxide, silicon oxynitrides, or a combination thereof, and may have a thickness ranging from 2 nm to approximately 100 nm, preferably approximately 2 nm to approximately 25 nm. The spacers may be made of an insulating material, such as, for example, silicon nitride, silicon oxide, silicon oxynitrides, or a combination thereof. The spacers 130 may be formed by any method known in the art, including depositing a conformal silicon nitride layer over the PFET gate structure 150 and the NFET gate structure 155 and removing unwanted material from the conformal silicon nitride layer using an anisotropic etching process such as, for example, reactive ion etching (RIE) or plasma etching (not shown). Methods of forming spacers are well-known in the art and other methods are explicitly contemplated. Further, in various embodiments, the spacers 130 may include one or more layers. While the spacers 130 are herein described in the plural, the spacers 130 may consist of a single spacer surrounding each of the PFET gate structure 150 and the NFET gate structure 155.

Figure 1E:
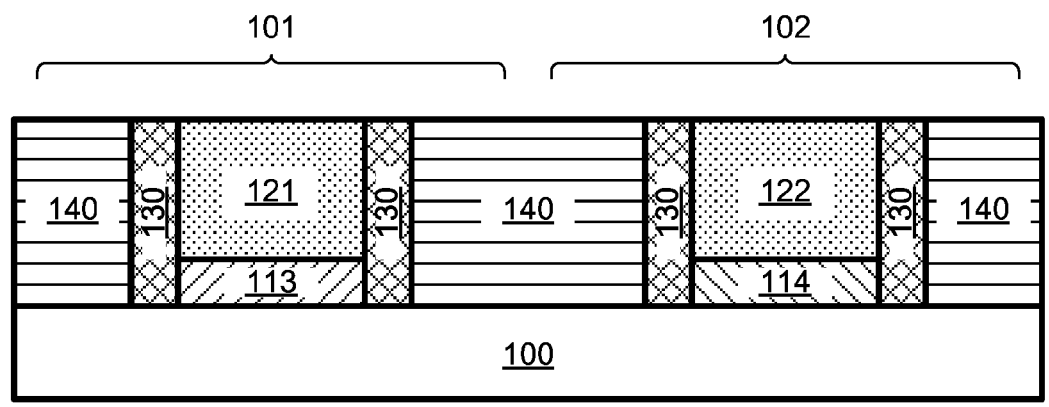
FIG. 1e is a side view depicting depositing an ILD layer surrounding the gates, according to an exemplary embodiment.

Referring to FIG. 1e, an interlevel dielectric (ILD) layer 140 may be deposited to surround the PFET gate structure 150 and the NFET gate structure 155 (FIG. 1d). The ILD layer 140 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics and may be formed using any suitable deposition techniques including ALD, CVD, plasma enhanced CVD, spin on deposition, or PVD. In some embodiments, the ILD layer 140 may be a dummy ILD. In some embodiments, various barriers or liners (not shown) may be formed below the ILD layer 140. After deposition, the ILD layer 140 may be planarized, using, for example, chemical-mechanical planarization (CMP) to remove excess material and expose the PFET dummy gate 121 and the NFET dummy gate 122, so that the ILD layer 140 has approximately the same height as the PFET gate structure 150 and the NFET gate structure 155.

Figure 1F:
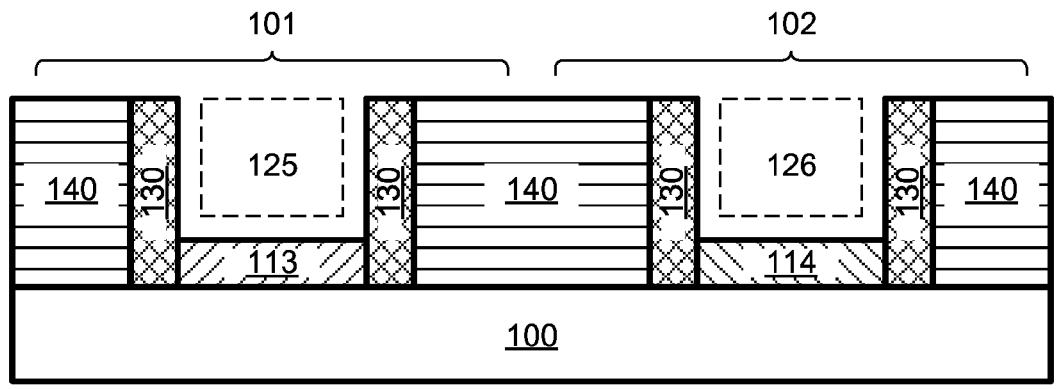
FIG. 1f is a side view depicting removing the dummy gate electrodes, according to an exemplary embodiment.

Referring to FIG. 1f, the PFET dummy gate 121 and the NFET dummy gate 122 may be removed to form a PFET gate cavity 125 and an NFET gate cavity 126. The PFET dummy gate 121 and the NFET dummy gate 122 may be removed by any suitable etching process known in the art capable of selectively removing the PFET dummy gate 121 and the NFET dummy gate 122 (FIG. 1e) without substantially removing material from the surrounding structures, including, for example, the spacers 130, the ILD layer 140, or the first PFET oxide gate layer 113 and the first NFET oxide gate layer 114. In an exemplary embodiment, the PFET dummy gate 121 and the NFET dummy gate 122 may be removed, for example, by a reactive ion etching (RIE) process capable of selectively removing silicon. While ensuring that all of the PFET dummy gate 121 and the NFET dummy gate 122 are removed, etching may react with layers located below, such as the first PFET oxide gate layer 113 and the first NFET oxide gate layer 114. This reaction can cause pits or holes in the first PFET oxide gate layer 113 and the first NFET oxide gate layer 114, and such imperfections may lead to detrimental impacts in the performance of the final the gate dielectric layer, thus impacting the performance of the final gates.

Figure 1G:
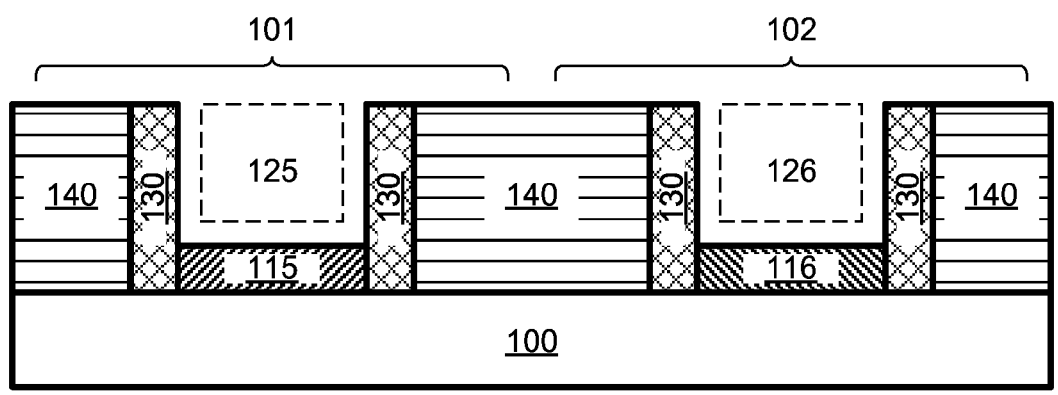
FIG. 1g is a side view depicting annealing and selectively nitriding the gate oxides, according to an exemplary embodiment.

Referring to FIG. 1g, the first PFET oxide gate layer 113 (FIG. 1O and the first NFET oxide gate layer 114 (FIG. 1O may be annealed to form a second PFET oxide gate layer 115 and a second NFET oxide gate layer 116 after the removal of the PFET dummy gate 121 (FIG. 1O and NFET dummy gate 122 (FIG. 1O. This anneal may correct imperfections in and increase the reliability of the second PFET oxide gate layer 115 and the second NFET oxide gate layer 116, by further densifying the first PFET oxide gate layer 113 and the first NFET oxide gate layer 114. The first PFET oxide gate layer 113 and the first NFET oxide gate layer 114 may be annealed at temperatures ranging from approximately 600° Celsius to approximately 1200° Celsius and may be annealed for approximately 10 to approximately 30 seconds. In some embodiments, the annealing temperature may be substantially uniform throughout the annealing period, however in other embodiments the annealing period may include one or more ramping cycles where the temperature is decreased or increased.

Still referring to FIG. 1g, in some embodiments, the first PFET oxide gate layer 113 and the first NFET oxide gate layer 114 may be selective nitrided to form a second PFET oxide gate layer 115 and a second NFET oxide gate layer 116. Nitriding the first NFET oxide gate layer 114 may improve TDDB of FETs formed in the NFET region 102, but may also cause NBTI degradation of FETs formed in the PFET region 101. Therefore, selectively nitriding the first NFET oxide gate layer 114 while protecting the first PFET oxide gate layer 113 may provide the benefits, without the detrimental impacts, of nitriding both the first NFET oxide gate layer 114 and the first PFET oxide gate layer 113. This may be accomplished, for example, by masking the first PFET oxide gate layer 113 with a nitrogen impermeable layer and nitriding the substrate, as described below in conjunction with FIGS. 3a-3f. Other suitable means of selectively nitriding the first NFET oxide gate layer 114 may be performed. In such instances, the second PFET oxide gate layer 115 and the second NFET oxide gate layer 116 may exhibit different nitrogen concentrations. However, in other embodiments, the nitridation process may not be performed, and the second PFET oxide gate layer 115 and the second NFET oxide gate layer 116 may have approximately the same nitrogen concentration as the first NFET oxide gate layer 114 and the first PFET oxide gate layer 113, respectively.

Figure 1H:
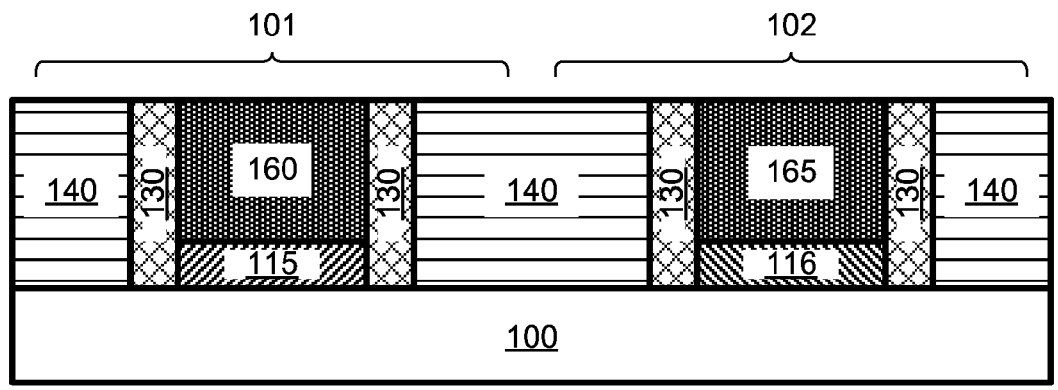
FIG. 1h is a side view depicting forming replacement metal gates, according to an exemplary embodiment.

Referring to FIG. 1h, a PFET replacement metal gate 160 may be formed in the PFET gate cavity 125 (FIG. 1g) and a NFET replacement metal gate 165 may be formed in the NFET gate cavity 126 (FIG. 1g). Depositing the PFET replacement metal gate 160 and the NFET replacement metal gate 165 may be accomplished using any suitable method known in the art, including for example typical deposition techniques such as CVD, PVD, and ALD, sputtering, and plating. The PFET replacement metal gate 160 and the NFET replacement metal gate 165 may include any number of liners, including for example a dielectric layer (not shown) and a work function metal layer or layers (not shown), and a gate electrode (not shown) filling the remainder of the PFET gate cavity 125 and the NFET gate cavity 126. The dielectric layer may include, for example, silicon oxide, hafnium oxide, zirconium oxide, aluminum oxide, titanium oxide, lanthanum oxide, strontium titanium oxide, lanthanum aluminum oxide, and mixtures thereof. The work function metal layer may include, for example, aluminum, lanthanum oxide, magnesium oxide, strontium titanate, and strontium oxide. The gate electrode may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof.

During fabrication, the high temperature anneal may be used prior to the formation of gates (FIG. 1b) or after the removal of the PFET dummy gate 121 and NFET dummy gate 122 (FIG. 1g). Such high temperature anneals may counteract the detrimental impacts that may occur during the formation, and subsequent processing, of replacement metal gate FET structures after gate dielectric layer deposition. Specifically, a first high temperature anneal may act to densify the PFET oxide layer 111 and the NFET oxide layer 112, which may make them, as well as the first PFET oxide gate layer 113 and the first NFET oxide gate layer 114, able to better withstand junction formation and removal of the PFET dummy gate 121 and the NFET dummy gate 122. In another embodiment, a second high temperature anneal of the first PFET oxide gate layer 113 and the first NFET oxide gate layer 114 after removal of the PFET dummy gate 121 and the NFET dummy gate 122 may act to repair the oxide layer that may have been damaged during junction formation and removal of the PFET dummy gate 121 and the NFET dummy gate 122. Furthermore, selective nitridation of the gate dielectric layers in the NFET region 102 may be beneficial in improving TDDB, and may be performed during the first or second high temperature anneal. In such embodiments, the second NFET oxide gate layer 116 would have a higher nitrogen concentration than the second PFET oxide gate layer 115.

Figure 2A:
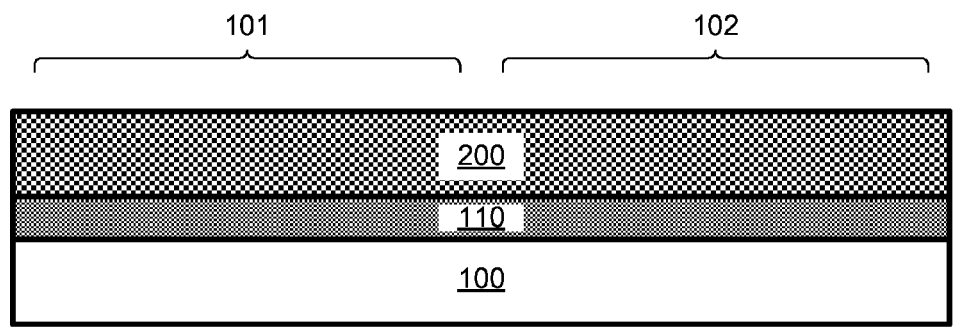
FIG. 2a is a side view depicting depositing a nitrogen impermeable layer on the oxide layer.
Figure 2B:
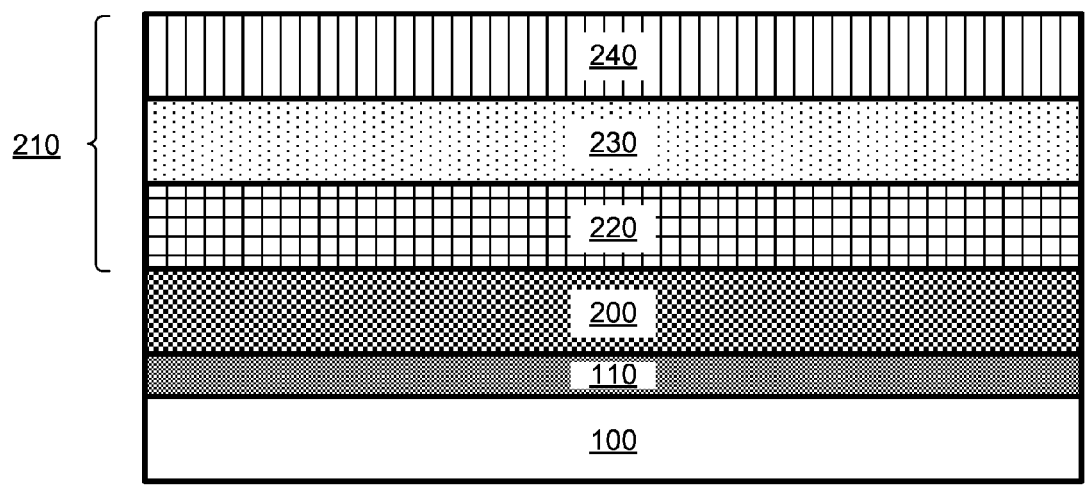
FIG. 2b is a side view depicting depositing a masking layer stack to pattern the nitrogen impermeable layer in the PFET region, according to an exemplary embodiment.
Figure 2C:
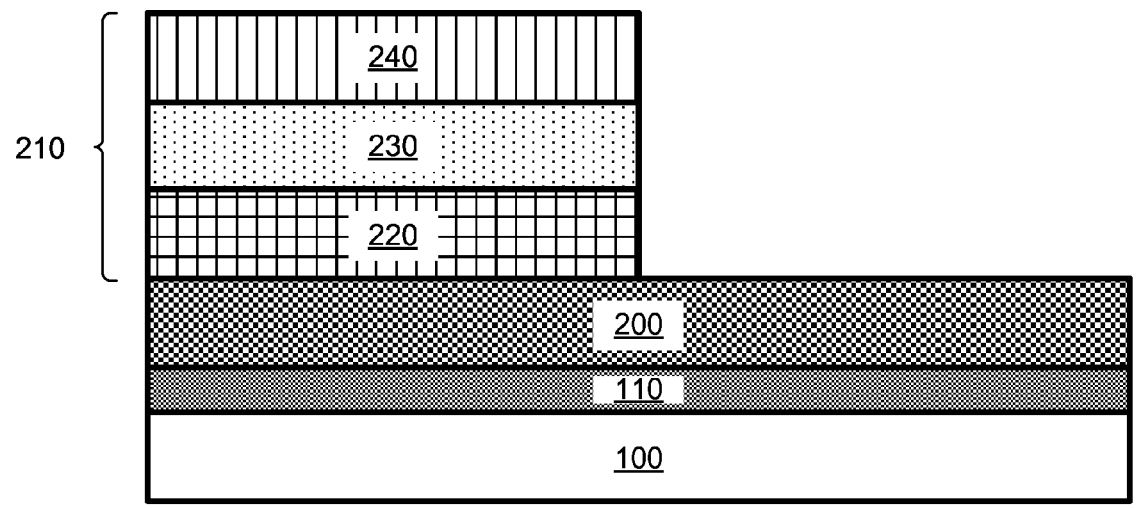
FIG. 2c is a side view depicting etching the oxide hardmask and the OPL layer of the masking layer stack, according to an exemplary embodiment.
Figure 2D:
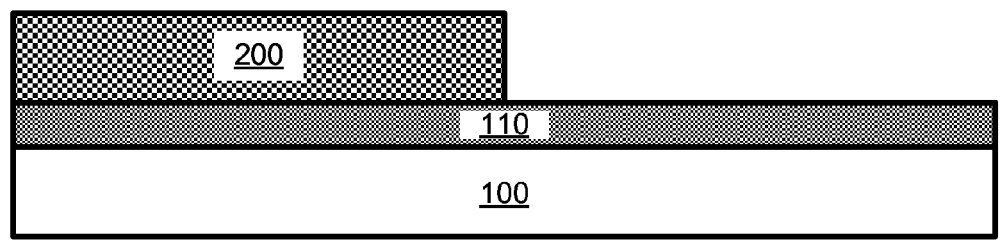
FIG. 2d is a side view depicting etching a portion of the nitrogen impermeable layer, according to an exemplary embodiment.
Figure 2E:
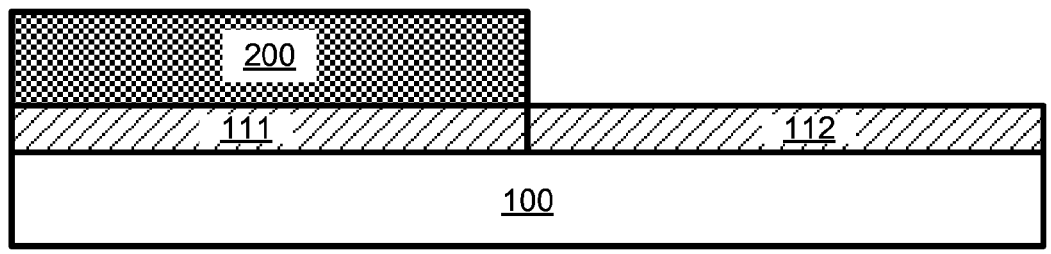
FIG. 2e is a side view depicting annealing and selectively nitriding the oxide layer, according to an exemplary embodiment.

Referring to FIGS. 2a-2f, as described above in conjunction with FIG. 1b, the oxide layer 110 may be selectively nitrided to form a PFET oxide layer 111 and an NFET oxide layer 112. In some embodiments, the selective nitridation of the oxide layer 110 may include masking a PFET region 101 of the structure with a nitrogen impermeable layer 200 (FIG. 2a). Masking of the PFET region 101 may be accomplished by depositing the nitrogen impermeable layer 200 above the oxide layer 110, covering a portion of the nitrogen impermeable layer 200 with a masking layer stack 210 (FIGS. 2b-2c) and selectively etching away the material covering the NFET region 102, while leaving the nitrogen impermeable layer 200 above the PFET region 101 (FIG. 2d). Nitridation may be performed while the nitrogen impermeable layer 200 is covering the PFET region 101 or regions of the semiconductor, while leaving the NFET region 102 exposed (FIG. 2e).

Referring to FIG. 2a, a nitrogen impermeable layer 200 may be deposited above the oxide layer 110. The nitrogen impermeable layer 200 may be made of any material suitable for restricting nitrogen from implanting in the PFET region 101 during a nitridation process. In such embodiments, the nitrogen impermeable layer may be made of, for example, TiN, TaN, WN, alloys thereof or a stack thereof. The nitrogen impermeable layer 200 may have any thickness suitable to restrict deposition or implantation of nitrogen in the PFET region 101, for example, thicknesses ranging from approximately 3 nm to approximately 20 nm.

Referring to FIG. 2b, a masking layer stack 210 may be deposited on the nitrogen impermeable layer 200. The masking layer stack 210 may be deposited on the nitrogen impermeable layer 200 to allow selective etching of the nitrogen impermeable layer 200 over the NFET region 102, while preserving the nitrogen impermeable region 200 over the PFET region 101. The masking layer stack 210 may include, for example, an organic planarization layer (OPL) 220, an oxide hardmask 230, and a photoresist layer 240. The masking layer stack 210 may be formed by any suitable deposition technique or techniques known in the art, including, for example, ALD, CVD, PVD, MBD, PLD, and LSMCD. The OPL 220 may be included to form a level surface for deposition of additional layers. Accordingly, the OPL 220 may have any thickness suitable to cover the nitrogen impermeable layer and have a substantially flat top surface. The oxide hardmask 230 may be deposited between the OPL 220 and the photoresist layer 240 to form a more robust masking layer than the photoresist layer 240 and improve the integrity of the etching process. The oxide hard mask 230 may be made of any suitable oxide masking material, such as silicon oxide.

Referring to FIG. 2c, the masking layer stack 210 may be etched to expose a portion of the nitrogen impermeable layer 200 in the NFET region 102. Prior to etching, photoresist layer 240 is patterned, using known lithographic patterning techniques, to the desired structure. Etching the masking layer stack 210 may be accomplished through any combination of known techniques, such as, for example, RIE, wet stripping and plasma etching. In a preferred embodiment, reactive ion etching may be performed to remove an oxide hardmask 230 and OPL 220 above the NFET region 102.

Referring to FIG. 2d, the nitrogen impermeable layer 200 may be selectively etched in the NFET region 102 using the masking layer stack 210 (FIG. 2c) as a mask to protect the PFET region 101. Removal of the masking layer stack 210 may occur during, or following, the selective etching of nitrogen impermeable layer 200. Removal of nitrogen impermeable layer 200 may be accomplished through any combination of known techniques, such as, for example, RIE, wet stripping and plasma etching. In an exemplary embodiment where the nitrogen impermeable layer 200 is made of titanium nitride, the nitrogen impermeable layer 200 may be selectively etched in the NFET region 102 by dilute HF wet-stripping.

Referring to FIG. 2e, the oxide layer 110 (FIG. 2d) in the NFET region 102 may be nitrided. During nitridation, nitrogen is incorporated into the physically exposed portions of the oxide layer 110 to convert to exposed oxide into an oxynitride. Selectively nitriding the NFET region 102 of oxide layer 110 creates the NFET oxide layer 112, which following nitridation contains a higher level of nitrogen than the PFET oxide layer 111. This difference may improve the TDDB of gates in the NFET region 102. Nitridation may be a thermal nitridation process or a plasma nitridation process. Nitridation of the oxide layer 110 may be performed simultaneously with the annealing process described above in conjunction with FIG. 1b, by placing the structure into an annealing furnace with a suitable nitrogen environment such as, for example, $NH_3$ and $N_2$. Accordingly, nitridation may occur at the same conditions as the annealing process. Alternatively, nitridation of the oxide layer 110 may be performed before or after the annealing process under different conditions, either in or out of the annealing furnace.

Figure 2F:
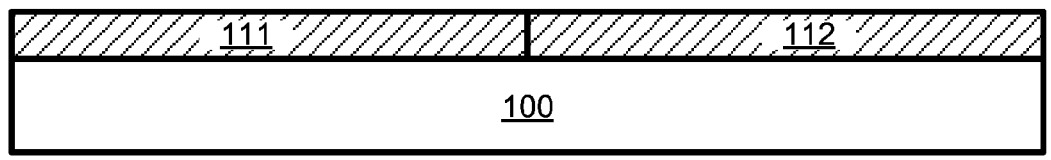
FIG. 2f is a side view depicting removing the nitrogen impermeable layer, according to an exemplary embodiment.

Referring to FIG. 2f, the remaining portion of the nitrogen impermeable layer may be removed by etching. Removing the nitrogen impermeable layer 200 may be accomplished by any suitable means, such as RIE, plasma etching and wet-stripping the nitrogen impermeable layer 200. In an exemplary embodiment where the nitrogen impermeable layer 200 is made of titanium nitride, the remaining portion of the nitrogen impermeable layer 200 may be removed by dilute HF wetstripping.

Figure 3A:
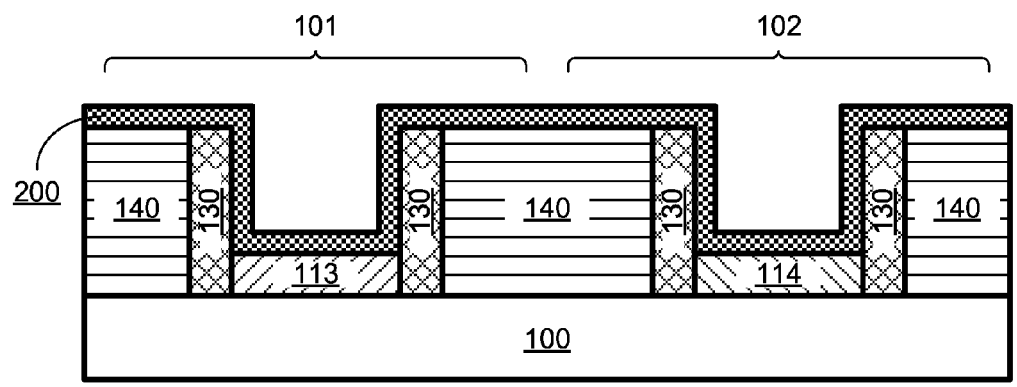
FIG. 3a is a side view depicting depositing a nitrogen impermeable layer on the gate oxides.
Figure 3B:
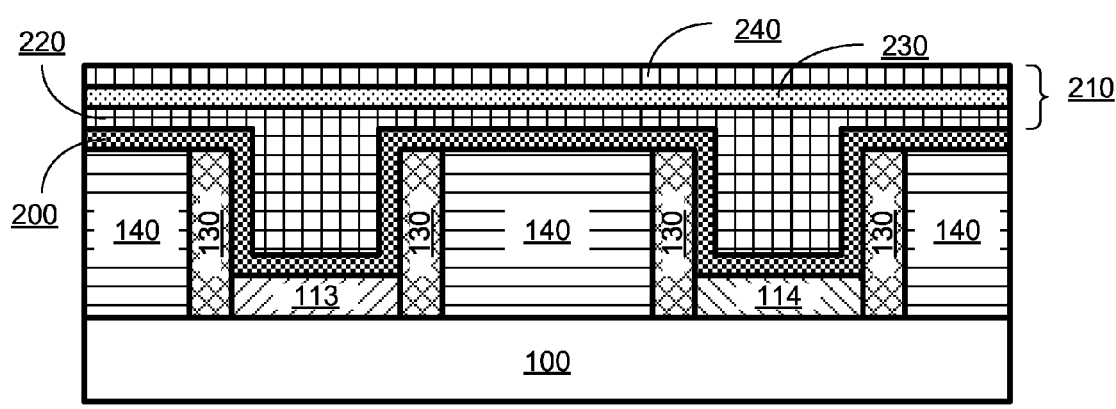
FIG. 3b is a side view depicting depositing a masking layer stack to pattern the nitrogen impermeable layer in the PFET region, according to an exemplary embodiment.
Figure 3C:
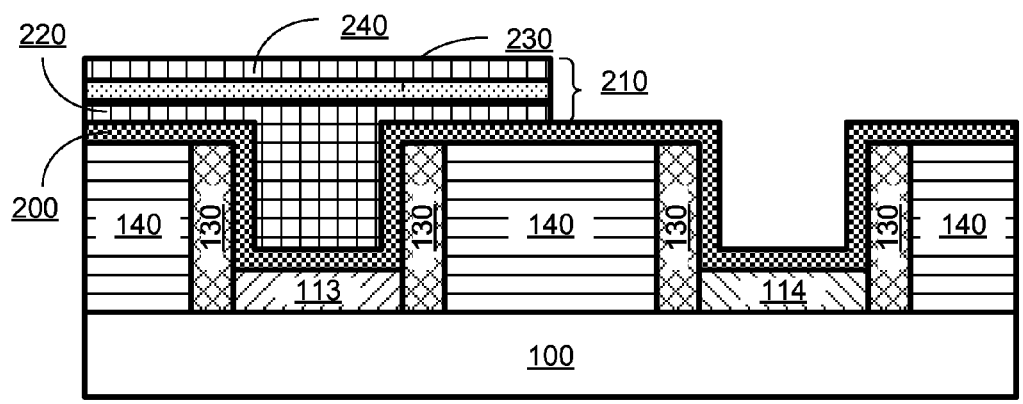
FIG. 3c is a side view depicting etching a portion of the oxide hardmask and the OPL layer of the masking layer stack, according to an exemplary embodiment.
Figure 3D:
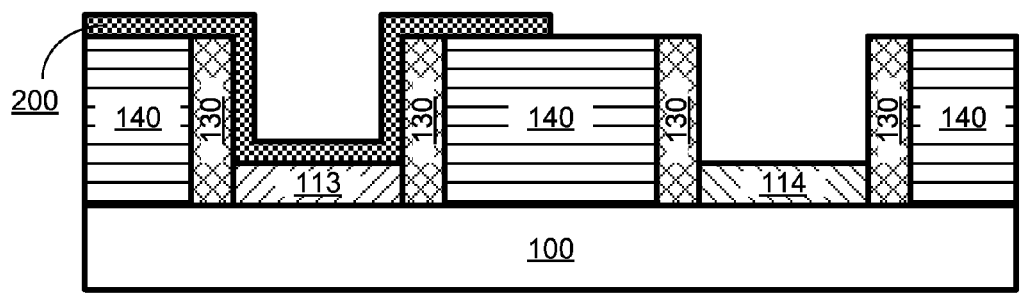
FIG. 3d is a side view depicting etching a portion of the nitrogen impermeable layer, according to an exemplary embodiment.
Figure 3E:
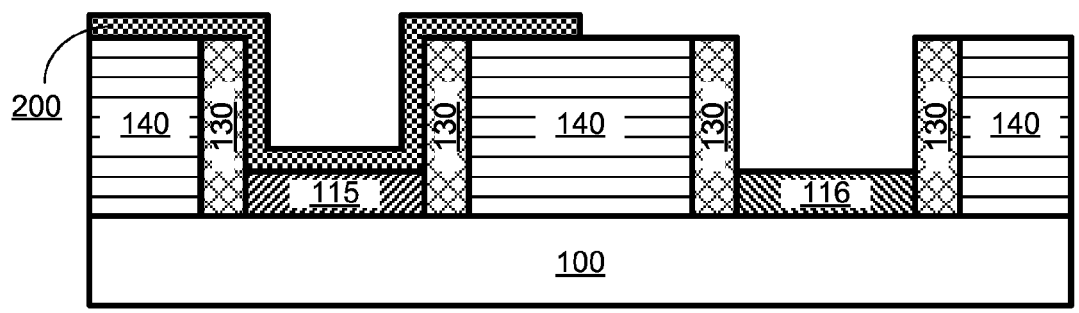
FIG. 3e is a side view depicting annealing and selectively nitriding the gate oxide, according to an exemplary embodiment.
Figure 3F:
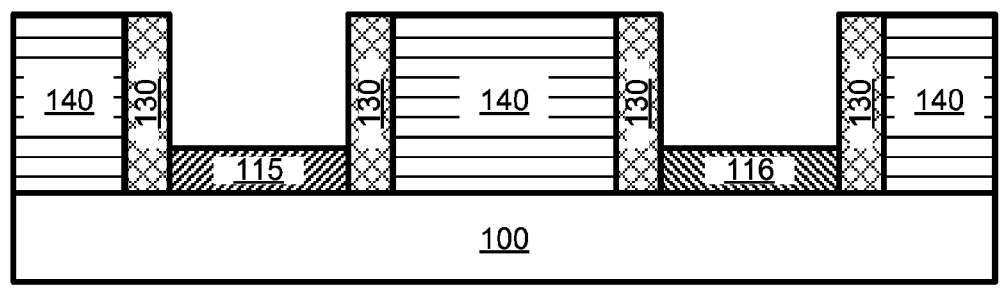
FIG. 3f is a side view depicting removing the nitrogen impermeable layer, according to an exemplary embodiment.

Referring to FIGS. 3a-3f, as described above in conjunction with FIG. 1g, the first PFET oxide layer 113 (FIG. 1f) and the first NFET oxide layer 114 (FIG. 1f) may be selectively nitrided to form the second PFET oxide layer 115 and the second NFET oxide layer 116. In some embodiments, the first NFET gate oxide layer 114 may include masking a PFET region 101 of the structure with a nitrogen impermeable layer 200 (FIG. 3a). Masking of a PFET region 101 is accomplished by depositing the nitrogen impermeable layer 200 above the first PFET gate oxide layer 113, covering a portion of the nitrogen impermeable layer 200 with a Masking layer stack 210 (FIGS. 3b-3c) and selectively etching away the material covering the NFET region 102, while leaving the nitrogen impermeable layer 200 above the PFET region 101 (FIG. 3d). Nitridation may be performed while the nitrogen impermeable layer 200 is covering the PFET region 101 or regions of the semiconductor, while leaving the NFET region 102 exposed (FIG. 3e).

Referring to FIG. 3a, a nitrogen impermeable layer 200 may be deposited above the first PFET oxide layer 113 and first NFET oxide layer 114. The nitrogen impermeable layer 200 may be made of any material suitable for restricting nitrogen from implanting in the PFET region 101 during a nitridation process. In such embodiments, the nitrogen impermeable layer may be, for example, TiN, TaN, WN, alloys thereof or a stack thereof. The nitrogen impermeable layer 200 may have any thickness suitable to restrict deposition or implantation of nitrogen in the PFET region 101, for example, thicknesses ranging from approximately 3 nm to approximately 20 nm.

Referring to FIG. 3b, a masking layer stack 210 may be deposited on the nitrogen impermeable layer 200. The masking layer stack 210 may be deposited on the nitrogen impermeable layer 200 to allow selective etching of the nitrogen impermeable layer 200 over the NFET region 102, while preserving the nitrogen impermeable region 200 over the PFET region 101. The masking layer stack 210 may include, for example, an organic planarization layer (OPL) 220, an oxide hardmask 230, and a photoresist layer 240. The masking layer stack 210 may be formed by any suitable deposition technique or techniques known in the art, including, for example, ALD, CVD, PVD, MBD, PLD, and LSMCD. The OPL 220 may be included to form a level surface for deposition of additional layers. Accordingly, the OPL 220 may have any thickness suitable to cover the nitrogen impermeable layer and have a substantially flat top surface. The oxide hardmask 230 may be deposited between the OPL 220 and the photoresist layer 240 to form a more robust masking layer than the photoresist layer 240 and improve the integrity of the etching process. The oxide hard mask 230 may be made of any suitable oxide masking material, such as silicon oxide.

Referring to FIG. 3c, the masking layer stack 210 may be etched to expose a portion of the nitrogen impermeable layer 200 in the NFET region 102. Prior to etching, photoresist layer 240 is patterned, using known lithographic patterning techniques, to the desired structure. Etching the masking layer stack 210 may be accomplished through any combination of known techniques, such as, for example, RIE, wet stripping and plasma etching. In a preferred embodiment, reactive ion etching may be performed to remove an oxide hardmask 230 and OPL 220 above the NFET region 102.

Referring to FIG. 3d, the nitrogen impermeable layer 200 may be selectively etched in the NFET region 102 using the masking layer stack 210 (FIG. 3c) as a mask to protect the PFET region 101. Removal of the masking layer stack 210 may occur during, or following, the selective etching of nitrogen impermeable layer 200. Removal of nitrogen impermeable layer 200 may be accomplished through any combination of known techniques, such as, for example, RIE, wet stripping and plasma etching. In an exemplary embodiment where the nitrogen impermeable layer 200 is made of titanium nitride, the nitrogen impermeable layer 200 may be selectively etched in the NFET region 102 by dilute HF wet-stripping.

Referring to FIG. 3e, the first NFET gate oxide layer 114 (FIG. 3d) in the NFET region 102 may be nitrided. During nitridation, nitrogen is incorporated into the physically exposed portions of the first NFET gate oxide layer 114. Selectively nitriding the first NFET gate oxide layer 114 creates the second NFET oxide layer 116, which following nitridation contains a higher level of nitrogen than the first NFET gate oxide layer 114 and the second PFET oxide layer 115. This difference may improve the TDDB of gates in the NFET region 102. Nitridation may be a thermal nitridation process or a plasma nitridation process. Nitridation of the first NFET gate oxide layer 114 may be performed simultaneously with the annealing process described above in conjunction with FIG. 1g, by placing the structure into an annealing furnace with a suitable nitrogen environment such as, for example, $NH_3$ and $N_2$. Accordingly, nitridation may occur at the same conditions as the annealing process. Alternatively, nitridation of the first NFET gate oxide layer 114 may be performed before or after the annealing process under different conditions, either in or out of the annealing furnace.

Referring to FIG. 3 *f*, the remaining portion of the nitrogen impermeable layer may be removed by etching. Removing the nitrogen impermeable layer 200 may be accomplished by any suitable means, such as RIE, plasma etching and wet-stripping the nitrogen impermeable layer 200. In an exemplary embodiment where the nitrogen impermeable layer 200 is made of titanium nitride, the remaining portion of the nitrogen impermeable layer 200 may be removed by dilute HF wetstripping.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of manufacturing a semiconductor structure, the method comprising:
    forming an oxide layer above a substrate;
    annealing the oxide layer to densify the oxide layer;
    forming a first sacrificial gate comprising a first gate oxide layer and a first dummy gate above the substrate, wherein forming the first sacrificial gate comprises:
        depositing a dummy gate layer above the oxide layer;
        etching the dummy gate layer to form the first dummy gate; and
        etching the oxide layer to form the first gate oxide layer separating the first dummy gate from the substrate,
    removing the first dummy gate of the first sacrificial gate;
    annealing the first gate oxide layer; and
    forming a first replacement metal gate above the gate oxide layer.

2. The method of claim 1, wherein forming the oxide layer above the substrate comprises depositing a silicon oxide layer on the substrate.

3. The method of claim 1, wherein annealing the first gate oxide layer repairs damage caused to the first gate oxide layer by removing the first dummy gate.

4. The method of claim 1, wherein the first sacrificial gate is formed in a PFET region of the substrate, the method further comprising:
    forming a second sacrificial gate above the substrate in an NFET region of the substrate, wherein forming the second sacrificial gate comprises:
        etching the dummy gate layer to form a second dummy gate; and
        etching the oxide layer to form a second gate oxide layer separating the dummy gate from the substrate,
    removing the second dummy gate;
    annealing the second gate oxide layer; and
    forming a second replacement metal gate above the gate oxide layer.

5. The method of claim 4, wherein annealing the oxide layer further comprises selectively nitriding the oxide layer above the NFET region of the substrate, so that the second gate oxide layer has a greater nitrogen concentration than the first gate oxide layer.

6. The method of claim 5, wherein selectively nitriding the oxide layer comprises:
    depositing a nitrogen impermeable layer above the oxide layer;
    etching the nitrogen impermeable layer to expose the oxide layer above the NFET region of the substrate while the oxide layer above the PFET region of the substrate remains covered by the nitrogen impermeable layer;
    exposing the oxide layer to a nitrogen environment while annealing oxide layer; and
    removing the nitrogen impermeable layer.

7. The method of claim 6, wherein the nitrogen impermeable layer comprises titanium nitride.

8. The method of claim 4, wherein annealing the second gate oxide further comprises selectively nitriding the second gate oxide so that the second gate oxide layer has a greater nitrogen concentration than the first gate oxide layer.

9. The method of claim 8, wherein selectively nitriding the second gate oxide comprises:
    depositing a nitrogen impermeable layer above the first gate oxide layer and the second gate oxide layer after removing the first dummy gate and the second dummy gate;
    etching the nitrogen impermeable layer to expose the second gate oxide layer while the first gate oxide layer remains covered by the nitrogen impermeable layer;
    exposing the second gate oxide layer to a nitrogen environment while annealing the first gate oxide layer and the second gate oxide layer; and
    removing the nitrogen impermeable layer.

10. The method of claim 9, wherein the nitrogen impermeable layer comprises titanium nitride.

11. A method of manufacturing a semiconductor structure, the method comprising:
    forming an oxide layer above a substrate;
    annealing the oxide layer;
    selectively nitriding a portion of the oxide layer to form an NFET oxide layer, wherein a PFET oxide layer comprises an un-nitrided portion of the oxide layer;
    depositing a dummy gate layer above the NFET oxide layer and the PFET oxide layer;
    etching the dummy gate layer to form a first dummy gate above the NFET oxide layer and a second dummy gate above the PFET oxide layer;
    etching the NFET oxide layer to form an NFET oxide gate layer between the first dummy gate and the substrate;
    etching the PFET oxide layer to form an PFET oxide gate layer between the second dummy gate and the substrate; and
    replacing the first dummy gate with a first replacement metal gate and the second dummy gate with a second replacement metal gate.

12. The method of claim 11, wherein annealing the oxide layer comprises densifying the oxide layer.

13. The method of claim 11, wherein selectively nitriding a portion of the oxide layer to form an NFET oxide layer comprises:
    depositing a nitrogen impermeable layer above the oxide layer;
    etching the nitrogen impermeable layer to expose a first portion of the oxide layer above the NFET region of the substrate while the oxide layer above the PFET region of the substrate remains covered by the nitrogen impermeable layer;

exposing the oxide layer to a nitrogen environment while annealing oxide layer; and removing the nitrogen impermeable layer.

14. The method of claim 11, wherein replacing the first dummy gate with a first replacement metal gate and the second dummy gate with a second replacement metal gate comprises:

removing the first dummy gate and the second dummy gate;

annealing the NFET oxide layer and the PFET oxide layer; and forming a first replacement metal gate above the NFET oxide gate layer and second replacement metal gate above the PFET oxide gate layer.

15. The method of claim 14, wherein annealing the NFET oxide layer and the PFET oxide layer further comprises selectively nitriding the NFET oxide layer prior to forming the first replacement metal gate above the NFET oxide gate layer and second replacement metal gate above the PFET oxide gate layer.

16. A method of manufacturing a semiconductor structure, the method comprising:

forming an oxide layer above a substrate;

depositing a dummy gate layer above the oxide layer;

etching the dummy gate layer to form a first dummy gate and a second dummy gate above the oxide layer;

etching the oxide layer to form a first oxide gate layer between the first dummy gate and the substrate and a second oxide gate layer between the second dummy gate and the substrate;

removing the first dummy gate and the second dummy gate to expose the first oxide gate layer and the second oxide gate layer;

annealing the first oxide gate layer and the second oxide gate layer;

selectively nitriding the first oxide gate layer, so that the first gate oxide layer has a greater nitrogen concentration than the second gate oxide layer; and forming a first replacement metal gate above the first oxide gate layer and a second replacement metal gate above the second oxide gate layer.

17. The method of claim 16, wherein annealing the first oxide gate layer and the second oxide gate layer repairs damage caused by removing the first dummy gate and the second dummy gate.

18. The method of claim 16, wherein selectively nitriding the first oxide gate layer comprises:

depositing a nitrogen impermeable layer above the first gate oxide layer and the second gate oxide layer after removing the first dummy gate and the second dummy gate;

etching the nitrogen impermeable layer to expose the second gate oxide layer while the first gate oxide layer remains covered by the nitrogen impermeable layer;

exposing the second gate oxide layer to a nitrogen environment while annealing the first gate oxide layer and the second gate oxide layer; and removing the nitrogen impermeable layer.

19. The method of claim 16, further comprising annealing the oxide layer prior to depositing the dummy gate layer.

20. The method of claim 19, further comprising selectively nitriding a portion of the oxide layer prior to depositing the dummy gate layer.

* * * * *